HELIX CAVITY VOLTAGE CONTROLLED OSCILLATOR

Filed Jan. 2, 1969

INVENTOR
JOHN J. CONTUS

BY H. H. Losche

ATTORNEY

United States Patent Office 3,538,456
Patented Nov. 3, 1970

3,538,456
HELIX CAVITY VOLTAGE CONTROLLED OSCILLATOR

John J. Contus, Inglewood, Calif., assignor, by mesne assignments, to the United States of America as represented by the Secretary of the Navy Filed Jan. 2, 1969, Ser. No. 789,085
Int. Cl. H03b *5/18*; H03c *3/20*
U.S. Cl. 331—101 5 Claims

ABSTRACT OF THE DISCLOSURE

A precision frequency voltage controlled oscillator having a cavity contained floating helix coil with taps thereon connected to a field effect semiconductor device and to a voltage sensitive capacitor diode network with a variable voltage input to produce voltage oscillations having exceptionally high center frequency stability and high "Q" with a linear frequency response over a frequency range.

BACKGROUND OF THE INVENTION

This invention relates to voltage controlled oscillators utilizing a helix in the tuned circuit to provide precision frequency control and stability comparable to crystal controlled oscillators.

The best known prior art is believed to be the standard Hartley, Colpitts, or similar oscillators that are swept or have their frequency varied about a center point. Crystal controlled oscillators are capable of being controlled to sweep only about 0.1% of their fundamental frequency and the variations in power supply materially affect the frequency.

SUMMARY OF THE INVENTION

In the present invention a free floating helix mounted in a brass cavity has helix coil taps connected to the supply and gate terminals of a field effect semi-conductor device. The gate terminal of the field effect device coupled to the helix tap provides an input to which are coupled voltage sensitive capacitor diodes establishing a tuned circuit with the helix coil. The helix allows stability comparable to crystal controlled oscillators that are swept for a small fraction of their frequency. Where crystal controlled oscillators can be varied over approximately .1% of their fundamental frequecny, the helix voltage controlled oscillator (VCO) can be varied about 4 to 5 percent with superior linearity. The helix VCO is quite stable with power supply variations, such as variations of 10% in power supply voltages which cause variations of only .05% of the quiescent center frequency. It is therefore a general object of this invention to provide a helix cavity VCO with a field effect semi-conductor switching device and voltage sensitive capacitor diodes in the tuned circuit to produce superior frequency linearity for varied control voltages.

BRIEF DESCRIPTION OF THE DRAWING

These and other objects and the advantages, features, and uses of this invention will become more apparent to those skilled in the art as a more detailed description proceeds when considered along with the accompanying drawing, in which.

DESCRIPTION OF THE PREFERRED EMBODIMENT

Figure 1:
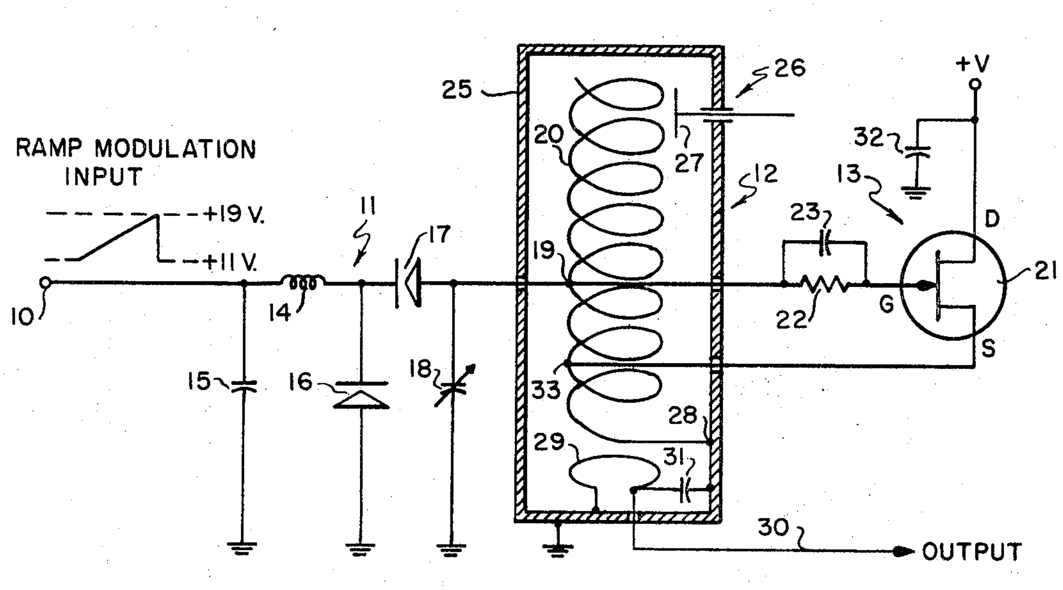
FIG. 1 is a circuit schematic diagram of the invention.
Figure 2:
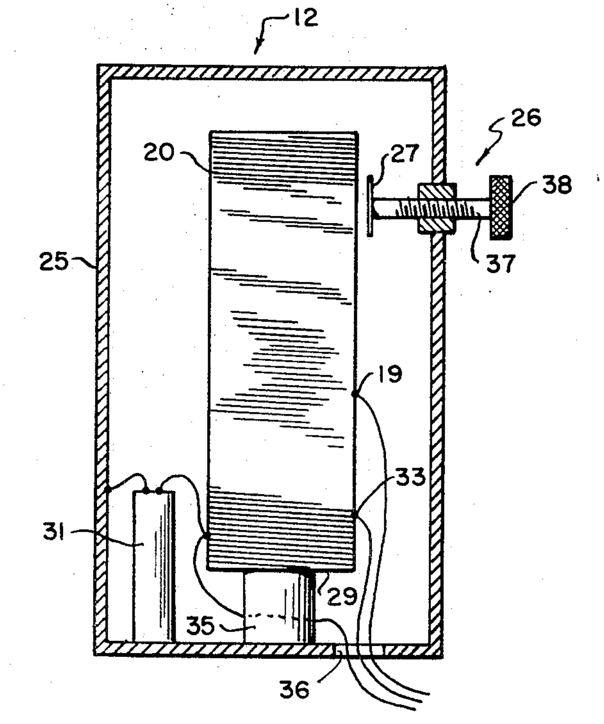
FIG. 2 is a partly elevational and partly sectional view of the helix cavity.

Referring more particularly to FIG. 1 showing a circuit schematic diagram of the oscillator, there is an input at terminal 10 for ramp modulation input voltages to be conducted by way of a voltage sensitive diode circuit 11, and a helix cavity 12, to a switching circuit 13. The input 10 has the modulation voltages conducted through an inductance 14, the input terminal of which has one plate of a capacitor 15 coupled thereto and the opposite plate grounded. The output lead of the inductance 14 is coupled in common to the cathode of each of two voltage sensitive capacitor diodes 16 and 17, known as "Epicaps," the anode of capacitor diode 16 being coupled to ground. The anode of the capacitor diode 17 is coupled to one plate of an adjustable capacitor 18, the opposite plate of which is grounded, and also to a tap 19 of a helix coil 20 in the helix cavity. Tap 19 also constitutes the input to the gate terminal of the switching circuit 13 which consists of a field effect transistor device 21. This input is through a parallel coupled resistor 22 and capacitor 23 biasing network The helix coil 20 is housed within a cylindrical metallic case 25, which may be of brass or other suitable material, and the leads to the various taps are connected through this cylindrical member by the use of electrical insulation or, as a more practical construction, through a single opening in the bottom of the cavity as shown in FIG. 2, later to be more fully described. The helix 20 has a fine frequency adjusting means 26 near the upper free end of the helix to adjust the plate 27 toward and away from the helix coil. The lower end of the helix coil 20 is connected to the cavity case 25 at 28 and the cavity case is grounded to a fixed potential of the circuit. An output coil 29 is in inductive relation to helix coil 20 having one end connected to the cavity case and the output terminating in the output conductor 30. The output 30 is coupled to one plate of a capacitor 31, the opposite plate of which is grounded.

Field effect transistor 21 has a drain terminal D coupled directly to a positive voltage source, this terminal being coupled to one plate of a capacitor 32, the opposite plate of which is grounded to filter off any A.C. signal voltages. The supply terminal S of the field effect transistor is coupled to a tap 33 on the helix coil 20 which may be about three turns from the ground end of the helix. The helix coil 20 between the tap 19 and ground, together with the adjustable capacitor 18 and the voltage sensitive capacitor diodes 16 and 17 and the inductance 14, provide a tuned circuit for the field effect transistor switching element 21 to produce oscillations on the output 30.

Referring more particularly to FIG. 2 where the helix cavity device is shown in greater detail, the helix coil 20 is supported within the cavity case 25 by a ceramic support 35. Capacitor 31 is fixed within the case and coupled to the coil 29 and to the cavity case as shown in FIG. 1. Terminals 19 and 33 have conductors extending through an opening 36 in the helix case for connection as shown in FIG. 1. The fine frequency adjustment 26 may be of any suitable construction but is herein shown as a screw threaded shaft 37 having a knurled knob 38 thereon to vary the space of the capacitor plate 27 with respect to the helix coil 20 although any other suitable fine frequency adjustment may be used.

Figure 3:
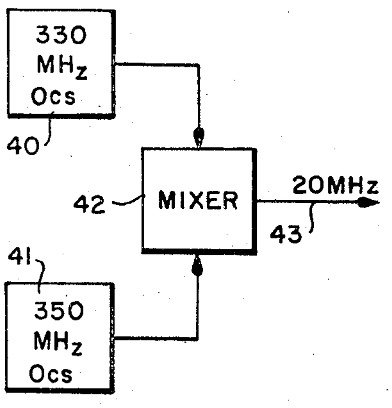
FIG. 3 is a modification showing a dual high frequency cavity version of the invention.

FIG. 3 illustrates in a block diagram two such oscillators such as a 330 megahertz (mHz.) oscillator 40 and a 350 mHz. oscillator 41 having the outputs coupled to a mixer circuit 42 to produce the difference of 20 mHz. on an output 43. While FIG. 3 illustrates a 20 mHz. output, any other high frequency output may be produced by the proper choice of oscillators 40 and 41.

OPERATION

In the operation of the device as shown in FIGS. 1 and 2 let it be assumed that a ramp modulation input voltage of +11 to +19 volts is applied to terminal 10. The drain terminal D of the field effect transistor device 21 will have a positive voltage applied thereto, such as 4½ volts from a voltage source. As one example of operation, the elements in FIG. 1 may have the following values:

| | | Values or types |
|---|---|---|
| Capacitors: | | |
| **15** and **32** | picofarads (pf.) | 1100 |
| **18** | pf. | 38 |
| **23** | pf. | 100 |
| **31** | pf. | 200 |
| "Epicaps" **16** and **17** | | MV1876 |
| Inductance **14** | microhenrys | 56 |
| Resistance **22** | megohms | 9.1 |

With the circuit of FIG. 1 in a voltage supply, voltage will be stored in capacitor 18 until the build-up is sufficient to gate the field effect transistor 21 to its conductive state which will increase the voltage on the source terminal S through the helix 20 to further increase the gating voltage to raise the field effect transistor conduction to saturation. This provides a rapid rise in the leading edge of the oscillator output. When saturation is complete, the current through the helix falls to zero which cuts off the field effect transistor until capacitor 18 has again accumulated sufficient voltage to again place the field effect transistor into conduction. Switching of the field effect transistor 21 will continue at an "off" and "on" frequency or repetition rate in accordance with the tuned circuit consisting of the helix part between terminal 19 and ground and the adjustable capacitor 18. Circuit tuning is accomplished by adjustment of the capacitor 18. With the example of the above values given, the output 30 will have a frequency in the order of 17.5 mHz. as the center frequency. This center frequency may be varied within limits by a ramp modulation input, shown in FIG. 1 to be from +11 to +19 volts applied to terminal 10. Since the voltage sensitive capacitor diode devices 16 and 17 are sensitive to voltage changes to produce changes in capacitance, the capacitive reactance of the tuned circuit hereinabove described will be changed in accordance with the modulation from 11 to 19 volts. The inductance 14 and the capacitance 15 are utilized herein for decoupling of the voltage sensitive capacitor diodes 16 and 17. Accordingly, the output 30 will produce approximately 500 kilohertz (kHz.) deviation from the 11 to 19 volts ramp modulation voltage. The use of the helix within a cavity, as shown and described, will produce a substantially linear frequency change in the output 30 with a very stable center frequency and with a high "Q."

This basic structure can be used from about 15 mHz. to one gigahertz (gHz.) with appropriate cavities 25. Outstanding linearity can be obtained in the output frequency due to small deviations required of the "Epicaps." On a 400 mHz. version, linearities of .05% can be obtained over a 12 mHz. bandwidth. "Q" of 800 or 1,000 are easily obtained, resulting in quiescent center frequency stabilities of .005%. The helix type oscillator shown and described herein may be used as a sweep oscillator for signal processing, radar delay lines sweeping, and spectrum analysis. Its small size, low cost, and wide bandwidth make it ideal for all swept oscillator requirements.

While many modifications and changes may be made in the constructional details and features of this invention and still maintain the spirit of the invention, it is to be understood that I desire to be limited in my invention only by the scope of the appended claims.

I claim:

1. A helix cavity voltage controlled oscillator comprising:
- a helix coil in a grounded cavity support;
- a field effect semiconductor device having two conduction electrodes and a control electrode, one of said conduction electrodes being coupled to a voltage supply, the other of said conduction electrode being coupled to a first tap on said helix, and said control electrode being coupled to a second tap on said helix through a parallel resistance-capacitance network;
- an input coupled through an inductance and a first voltage sensitive capacitor diode to said second tap of said helix, said input having a fixed capacitor in parallel therewith, a second voltage sensitive capacitor diode coupled between the junction of said inductance and said first voltage sensitive capacitor diode and a fixed potential, and a tuning capacitor coupled between said second helix tap and said fixed potential; and
- an output provided by an output loop in inductive relation to said helix whereby the oscillation frequency can be varied rapidly with precision from modulation voltages applied to said input.

2. A helix cavity voltage controlled oscillator as set forth in claim 1 wherein:
- said one and said other of said conduction electrodes of said field effect semiconductor device are drain and source terminals, and said control electrode is a gate terminal.

3. A helix cavity voltage controlled oscillator as set forth in claim 2 wherein:
- said helix in a grounded cavity support is a floating helix coil wound on a ceramic form affixed to the base of and within a closed cylindrical metallic form with a fine frequency adjustment therein.

4. A helix cavity voltage controlled oscillator as set forth in claim 3 wherein:
- said first and second voltage sensitive capacitor diodes are oriented with the cathodes coupled in common.

5. A helix cavity voltage controlled oscillator as set forth in claim 4 wherein:
- said helix coil has one end coupled to said cylindrical metallic form and the other end open, said first and second taps on progressively increasing number of turns of said coil from said cylindrical metallic form, respectively, and said fine frequency adjustment in adjustable relation to the open end of said coil.

References Cited

UNITED STATES PATENTS

| | | | |
|---|---|---|---|
| 1,970,952 | 8/1934 | Conklin | 331—101 |
| 2,254,590 | 9/1941 | Braaten | 331—96 |
| 2,752,494 | 6/1956 | Finke et al. | 331—101 |
| 3,246,266 | 4/1966 | Racy | 331—101 X |
| 3,416,096 | 12/1968 | Kim | 331—117 X |

ROY LAKE, Primary Examiner

S. H. GRIMM, Assistant Examiner

U.S. Cl. X.R.

331—111, 117, 177; 332—30; 333—82